United States Patent
Liang et al.

(10) Patent No.: US 11,188,461 B2
(45) Date of Patent: Nov. 30, 2021

(54) GARBAGE COLLECTION ADAPTED TO MEMORY DEVICE LIFE EXPECTANCY

(71) Applicant: Micron Technology, Inc., Boise, ID (US)

(72) Inventors: Qing Liang, Boise, ID (US); Deping He, Boise, ID (US); David Aaron Palmer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 2 days.

(21) Appl. No.: 16/445,769

(22) Filed: Jun. 19, 2019

(65) Prior Publication Data

US 2020/0401514 A1    Dec. 24, 2020

(51) Int. Cl.
| | |
|---|---|
| G06F 12/00 | (2006.01) |
| G06F 12/02 | (2006.01) |
| G11C 11/16 | (2006.01) |
| G11C 16/10 | (2006.01) |
| G11C 16/34 | (2006.01) |
| G11C 16/04 | (2006.01) |

(52) U.S. Cl.
CPC ...... *G06F 12/0253* (2013.01); *G11C 11/1659* (2013.01); *G11C 16/10* (2013.01); *G06F 12/0246* (2013.01); *G06F 2212/7205* (2013.01); *G06F 2212/7211* (2013.01); *G11C 16/0483* (2013.01); *G11C 16/3495* (2013.01); *G11C 2211/5641* (2013.01)

(58) Field of Classification Search
None
See application file for complete search history.

(56) References Cited

U.S. PATENT DOCUMENTS

| | | | |
|---|---|---|---|
| 9,632,926 B1* | 4/2017 | Souri | G06F 12/0253 |
| 9,652,382 B1 | 5/2017 | Subramanian et al. | |
| 9,740,437 B2 | 8/2017 | Mielke et al. | |
| 9,842,060 B1 | 12/2017 | Jannyavula Venkata et al. | |
| 10,871,919 B2* | 12/2020 | Hong | G06F 3/0644 |
| 2015/0043277 A1* | 2/2015 | Fitzpatrick | G06F 3/064 |
| | | | 365/185.11 |

(Continued)

OTHER PUBLICATIONS

Lee, Junghee, "A Semi-Preemptive Garbage Collector for Solid State Drives", IEEE International Symposium on Performance Analysis of Systems and Software, (Apr. 2011), 10 pgs.

*Primary Examiner* — Midys Rojas
(74) *Attorney, Agent, or Firm* — Schwegman Lundberg & Woessner, P.A.

(57) ABSTRACT

Systems and methods for adapting garbage collection (GC) operations in a memory device to an estimated device age are discussed. An exemplary memory device includes a memory controller to track an actual device age, determine a device wear metric using a physical write count and total writes over an expected lifetime of the memory device, estimate a wear-indicated device age, and adjust an amount of memory space to be freed by a GC operation according to the wear-indicated device age relative to the actual device age. The memory controller can also dynamically reallocate a portion of the memory cells between a single level cell (SLC) cache and a multi-level cell (MLC) storage according to the wear-indicated device age relative to the actual device age.

20 Claims, 10 Drawing Sheets

(56) References Cited

U.S. PATENT DOCUMENTS

| | | | |
|---|---|---|---|
| 2015/0143068 A1* | 5/2015 | Higgins | G06F 12/0238 |
| | | | 711/166 |
| 2016/0034206 A1* | 2/2016 | Ryan | G06F 12/0246 |
| | | | 711/103 |
| 2018/0267705 A1* | 9/2018 | Liu | G06F 3/0655 |
| 2018/0373655 A1* | 12/2018 | Liu | G06F 13/30 |

* cited by examiner

GARBAGE COLLECTION ADAPTED TO MEMORY DEVICE LIFE EXPECTANCY

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Both NOR and NAND architecture semiconductor memory arrays can be accessed through decoders that activate specific memory cells by selecting the word line coupled to their gates. In a NOR architecture semiconductor memory array, once activated, the selected memory cells can place their data values on bit lines, causing different currents to flow depending on the state at which a particular cell is programmed. In a NAND architecture semiconductor memory array, a high bias voltage may be applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, which refers to any memory cell that can store more than one bit of data per cell (i.e., that can represent more than two programmed states).

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In some examples, the SSDs can also include DRAM or SRAM (or other forms of memory die or other memory structures). An SSD can receive commands from a host in association with memory operations, such as read or write operations to transfer data (e.g., user data and associated integrity data, such as error data and address data, etc.) between the memory devices and the host, or erase operations to erase data from the memory devices.

A flash storage such as an SSD can only be written for a limited number of times. At the end of an SSD's usage life, data may be corrupted, or the device may be rendered unusable if measures are not proactively taken to manage the SSD's lifespan. In an SSD consisting of NAND flash memory cells, electrons are trapped to the memory cell each time when data is written (e.g., via a programming operation), and electrons are taken off when data is removed (e.g., via an erasure operation). Each time electrons go in and out through the tunnel oxide during a program/erase (P/E) cycle may wear out the tunnel oxide, and thus reduce the SSD's lifetime. The P/E cycles quantify an endurance of a flash device such as an SSD. Endurance may be expressed as a drive writes per day (DWPD), which measures how many times a host can overwrite the drive's entire size each day of its life. For example, for an SSD with a size of 200 GB and a warranty period of 5 years, if DWPD is 1, then 200 GB can be written into the device every day for the next five years. That corresponds to 200 GB×365 days×5 years=365 TB of cumulative writes before the device is expected to fail. If DWPD is 10, then every single day 10×200 GB=2 TB can be written into the device. Endurance may alternatively be expressed as terabytes written (TBW), which measures total data writable into the drive over its lifetime. For example, for an SSD rated for 365 TBW, up to 365 TB data can be written before the drive is set for replacement. The guaranteed TBW can be provided by the vendor in their specifications. A target writes per day can be calculated using the TBW and target lifetime (e.g., a warranty of target lifetime of 3-5 years). For example, for an SSD with a TBW of 120 TB and a 3 year warranty, target daily writes may be calculated as 120 TB/3 years/365 days/1024=110 GB per day. For a flash storage device such as an SSD, effective memory management solutions are required to keep a desirable device lifespan while at the same to maintain a satisfactory device performance and user experience.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
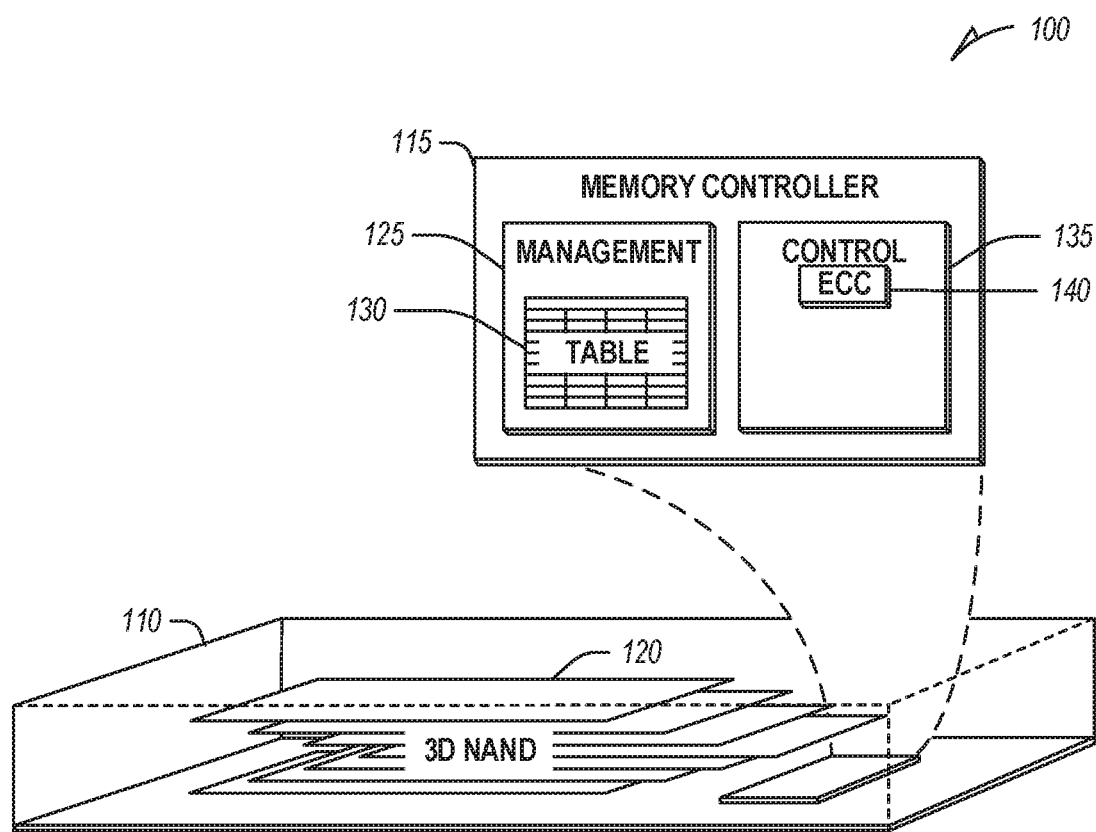
FIG. 1 illustrates an example of an environment including a memory device.

Normal operation of a flash memory may involve a large amount of writing (programming) and erasure of memory cells. Garbage collection (GC) is an operation to manage memory utilization in a flash memory. When the free physical space in a flash memory gets low, GC can recover free space on the storage device to allow for new host data to be written. During GC, a flash block that contains pages with valid data and pages with stale data (garbage) is read. Pages with the valid data are preserved, by writing to another fresh block. The logical block address is then updated with the new location. Pages with stale data marked for deletion remain on the location in the old block. Then, the entire old block (that contains pages with the stale data) is erased. The erased block can be added to the free block pool and used for a new incoming write. Such data written to pages and block erasure can lead to write amplification (WA). A numerical WA metric can be determined using a ratio of the amount of data physically written to the flash memory (physical writes) to the amount of data the host originally intended to write (host writes). The actual physical writes are generally larger than the host writes, resulting in a WA metric greater than one.

The GC operation can consume a lot of read/write bandwidth in a flash memory. As GC takes valid date already written by the host and rewrites them again, a large WA may result. The repeated physical act of moving data can degrade or wear out the insulator layer of tunnel oxide, reduce NAND flash lifespan, and slow down the device's erase process. When a block fails to erase, a spare block needs to be used. Eventually, when the spares run out, the SSD can fail. Additionally, if performed concurrently with host operations, GC can significantly degrade device performance and user experience. Moreover, if the GC operation is performed all the time, the storage device would consume all its available life very quickly, leading to an unusably short lifetime.

Various memory management approaches have been proposed to reduce or mitigate flash memory wear-out such as due to GC, and to maintain a desirable device lifespan. One approach, referred to as over-provisioning (OP), attempts to preserve a dedicated portion of the storage capacity for GC usage. The preserved storage is generally not accessible or usable by the host. With a higher OP and thus a smaller WA, degradation of the NAND device can be decreased, and lifetime can be extended. However, the benefit of a higher OP level is at the cost of less useable or accessible storage space to the host, thus reduced performance of the NAND device. Another approach is wear leveling, which involves evenly distributing P/E cycles to available cells to avoid overusing certain blocks. Frequently writing to or erasing the same blocks leads to more bad blocks, eventually wearing out the SSD. Yet another solution to the wear-out due to GC is by using a TRIM command that allows the host operating system to inform the SSD about the location of stale data marked for deletion. The SSD then accesses the stale data perform GC on a page level instead of managing whole blocks, thereby reducing WA and increasing SSD endurance.

However, these conventional approaches, among others, generally involve GC operations irrespective of host actual utilization of the device. This may have several drawbacks. Too much GC may reduce device performance and increase WA. In particular, if an SSD is overused and the GC engine does not adapt to device overuse, then aggressive GC activities may be performed, which can increase the WA and average NAND P/E cycles, shorten the device lifetime, and cause premature device failure. On the other hand, if the device is underused and the GC engine does not adapt to such device underuse, then conservative GC activities may be performed, which can reduce device performance and user experience. Therefore, there are still recognized unmet needs of memory management solutions that can improve device lifespan while maintaining a satisfactory device performance and user experience.

The present document describes examples of memory devices, systems, methods, and machine-readable mediums for adapting GC aggressiveness to a memory usage characteristic. According to some examples described herein, an adaptive GC engine may initiate or tune GC aggressiveness according to an estimated device age or life expectancy indicated by a current device wear metric. In this document, the GC aggressiveness refers to a size of memory space freed by the GC operations. A more aggressive GC therefore frees up more memory space than a less aggressive GC. The tuning (e.g., increasing or decreasing) of GC aggressiveness may include tuning one or more of GC speed, frequency, time duration, or a size of memory space (e.g., a number of erase blocks) targeted for GC operations, among other parameters. In various examples, tuning of GC aggressiveness may be based at least in part on a wear-indicated device age relative to an actual device age tracked over time and total writes over an expected lifetime of the memory device. The actual device age may be counted from a time of first use of the memory device (e.g., first memory write). For example, the adaptive GC engine can initiate or increase the amount of memory space to be freed by a GC operation if the actual device age exceeds the wear-indicated device age, and withhold the GC operation or decrease the amount of memory space to be freed by a GC operation if the actual device age is less than the wear-indicated device age. By addressing important issues of amount of GC to perform and when to initiate GC process, the adaptive GC described in this document can help improve a balance of user experience, device performance, and device lifetime.

Another aspect of the present document is a dynamic SLC cache with an adjustable cache size according to the memory usage statistic. In accordance with some examples discussed herein, an SLC cache controller can dynamically reallocate a portion of the memory cells between single level cell (SLC) cache and multi-level cell (MLC) storage based at least on the estimated device life expectancy, such as the wear-indicated device age. MLC is a NAND architecture that stores two or more bits per memory cell (compared to SLC that stores one bit per memory cell). MLC has both higher capacities and lower costs than SLC. However, SLC typically has higher endurance than MLC. SLC cache writing is generally faster than MLC writing, so the more free memory cells there are in the SLC cache, the more user data can be written by the host at high performance, leading to a better user experience. The SLC cache controller may increase or decrease the reallocation of memory cells in the SLC cache to MLC storage using information of wear-indicated device age. For example, if the actual device age exceeds the wear-indicated device age, then a large free block pools of SLC cache may be allocated for the user to improve device performance and user experience. Conversely, if the actual device age is less than the wear-indicated device age, then the SLC cache may be eliminated or its size may be reduced in favor of direct MLC (e.g., TLC or QLC) operation, such that a relatively small number of free blocks are maintained for the user. This may slow down device wear-out attributable to excessive GC operations, thereby extending device lifetime and preventing premature device failure.

The adaptive tuning of GC aggressiveness discussed in this document can be used in discretionary GC operations when there is still free memory space available in the device memory for host write (in contrast to mandatory GC operations, which are invoked when the device memory runs out of free memory space for the host to write). Therefore, a memory device implemented with the adaptive GC as discussed herein imposes no limitation to host usage of device, but can enhance user experience while at the same time supporting the TBW/time endurance without violating device lifetime.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

It is further noted that although embodiments are discussed in this document with reference to NAND media, said embodiments are not limited to NAND media and may be applied to NOR media. Furthermore, although some embodiments are discussed with reference to SSDs, said embodiments are not limited to SSDs, but may be used for other types of non-volatile storage devices such as nanowire memory, Ferro-electric transistor random access memory (FeTRAM), magnetoresistive random access memory (MRAM), flash memory, Spin Torque Transfer Random Access Memory (STTRAM), Resistive Random Access Memory, byte addressable 3-Dimensional Cross Point Memory, PCM (Phase Change Memory), etc.

FIG. 1 illustrates an example of a memory device 110 that may be included in a variety of products, such as Internet of Things (IoT) devices (e.g., a refrigerator or other appliance, sensor, motor or actuator, mobile communication device, automobile, drone, etc.) to support processing, communications, or control of a product. The memory device 110 includes a memory controller 115 and a memory array 120. The memory array 120 may include a number of individual memory die (e.g., a two-dimensional (2D) NAND die, or a stack of three-dimensional (3D) NAND die). The memory arrays 120 can be 2D structures arranged on a surface of a semiconductor substrate. To increase memory capacity for a given area, and to decrease cost, the size of the individual memory cells has decreased. Alternatively, memory arrays 120 can be 3D structures, such as 3D NAND memory devices that can further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure may extend adjacent a string of storage cells to form a channel for the storage cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of a host device. In other examples, the memory device 110 can be a portion of an integrated circuit (e.g., system on a chip (SOC), etc.), stacked or otherwise included with one or more other components of a host device.

The memory controller 115 can communicate with the memory array 120, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between a host and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between a host and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array may comprise a number of NAND dies and one or more functions of the memory controller 115 for a particular NAND die may be implemented on an on-die controller on that particular die. Other organizations and delineations of control functionality may also be utilized, such as a controller for each die, plane, superblock, block, page, and the like.

The memory array 120 can include several memory cells arranged in, for example, a number of devices, semi-conductor dies, planes, sub-blocks, blocks, or pages. In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
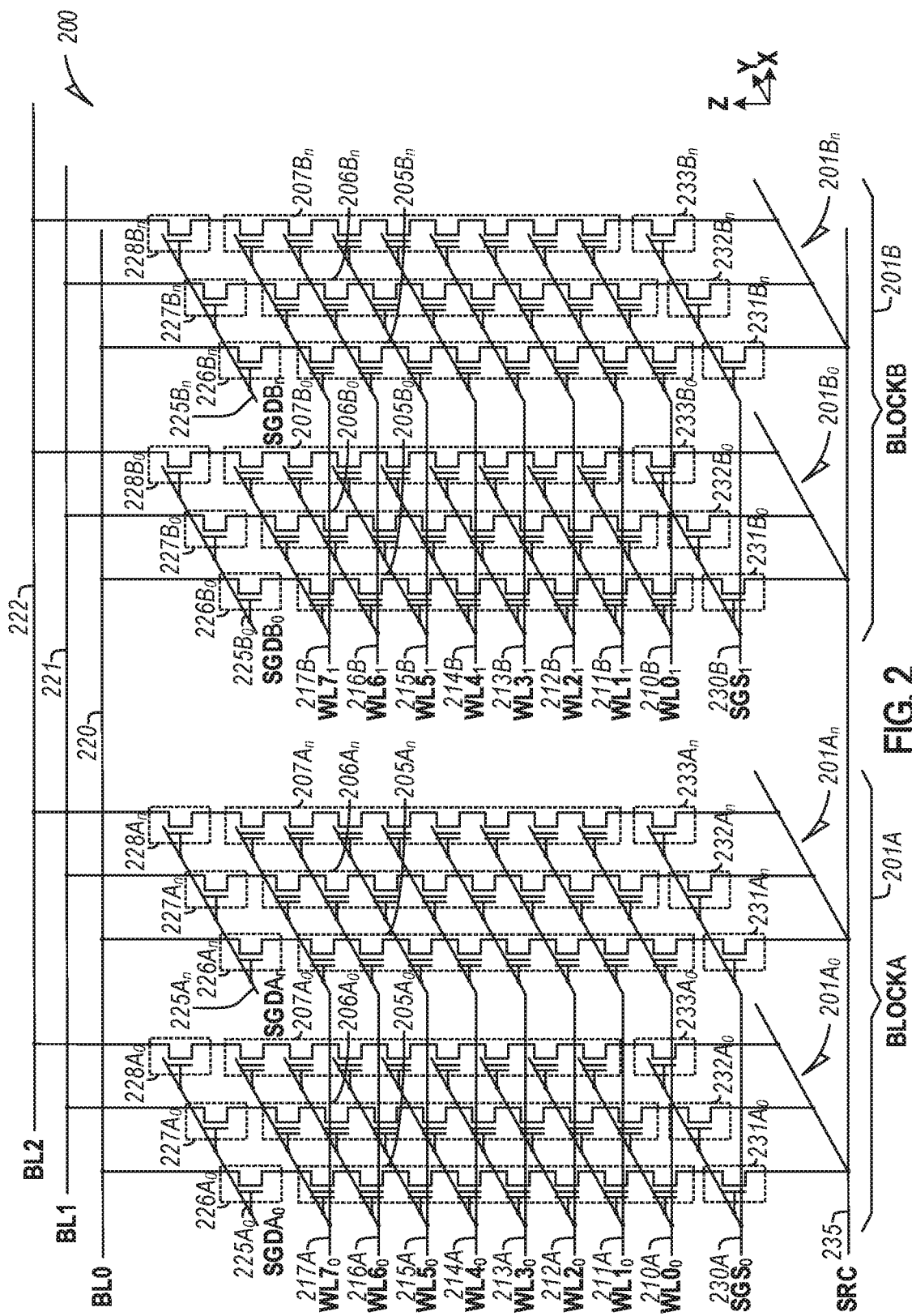
FIGS. 2-3 are schematic diagrams illustrating examples of NAND architecture semiconductor memory array.

FIG. 2 is a schematic diagram illustrating an example of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231A$_0$-233A$_0$, first-third A SGS 231A$_n$-233A$_n$, first-third B$_0$ SGS 231B$_0$-233B$_0$, first-third B$_n$ SGS 231B$_n$-233B$_n$, etc.) and a drain-side select gate (SGD) (e.g., first-third A$_0$ SGD 226A$_0$-228A$_0$, first-third A$_n$ SGD 226A$_n$-228A$_n$, first-third B$_0$ SGD 226B$_0$-228B$_0$, first-third B$_n$ SGD 226B$_n$-228B$_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) WL0$_0$-WL7$_0$ 210A-217A, WL0$_1$-WL7$_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third A$_0$ SGD 226A$_0$-228A$_0$ can be accessed using an A$_0$ SGD line SGDA$_0$ 225A$_0$, first-third A$_n$ SGD 226A$_n$-228A$_n$ can be accessed using an SGD line SGDA$_n$ 225A$_n$, first-third B$_0$ SGD 226B$_0$-228B$_0$ can be accessed using a B$_0$ SGD line SGDB$_0$ 225B, and first-third B$_n$ SGD 226B$_n$-228B$_n$ can be accessed using a B$_n$ SGD line SGDB$_n$ 225B$_n$. First-third A$_0$ SGS 231A$_0$-233A$_0$ and first-third A$_n$ SGS 231A$_n$-233A$_n$ can be accessed using a gate select line SGS$_0$ 230A, and first-third B$_0$ SGS 231B$_0$-233B$_0$ and first-third B$_n$ SGS 231B$_n$-233B$_n$ can be accessed via a gate select line SGS$_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., WLs).

Figure 3:
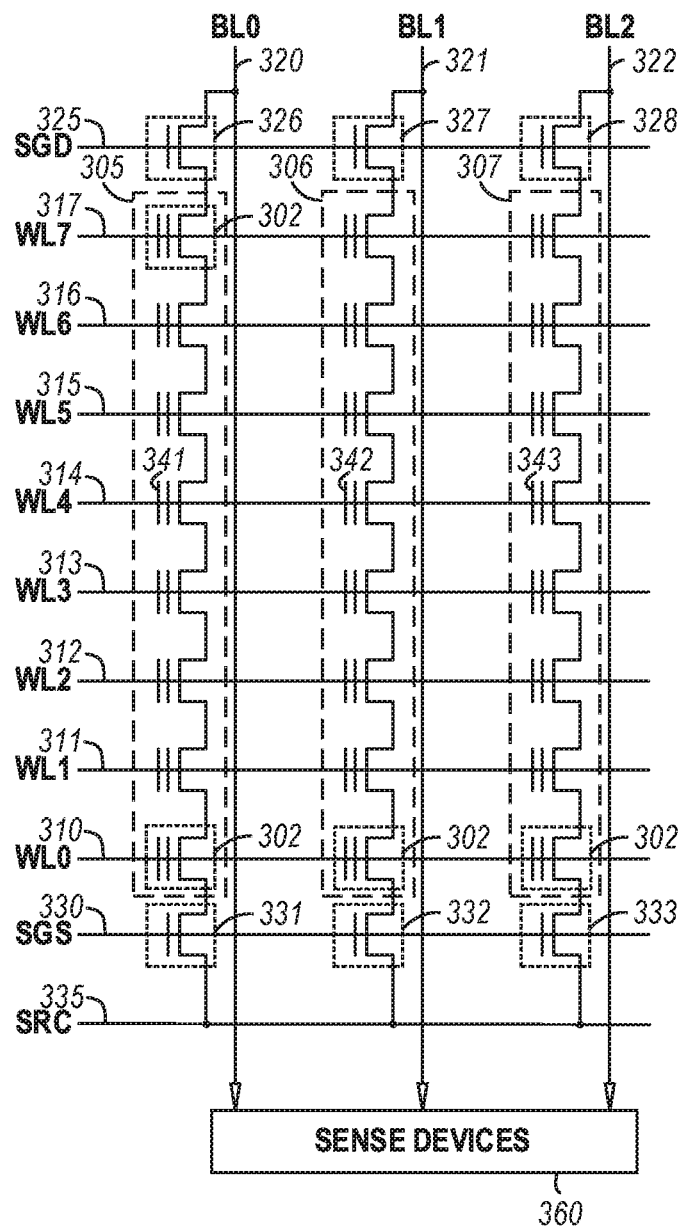

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential Vss, can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage ($V_{PASS}$) can be applied to one or more word lines having memory cells that are not targeted for programming, or an inhibit voltage (e.g., Vcc can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential Vss.

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground Vss, resulting in a charge transfer (e.g., direct injection or Fowler-Nordheim (FN) tunneling, etc.) from the floating gates of the targeted memory cells to the channels.

Figure 4:
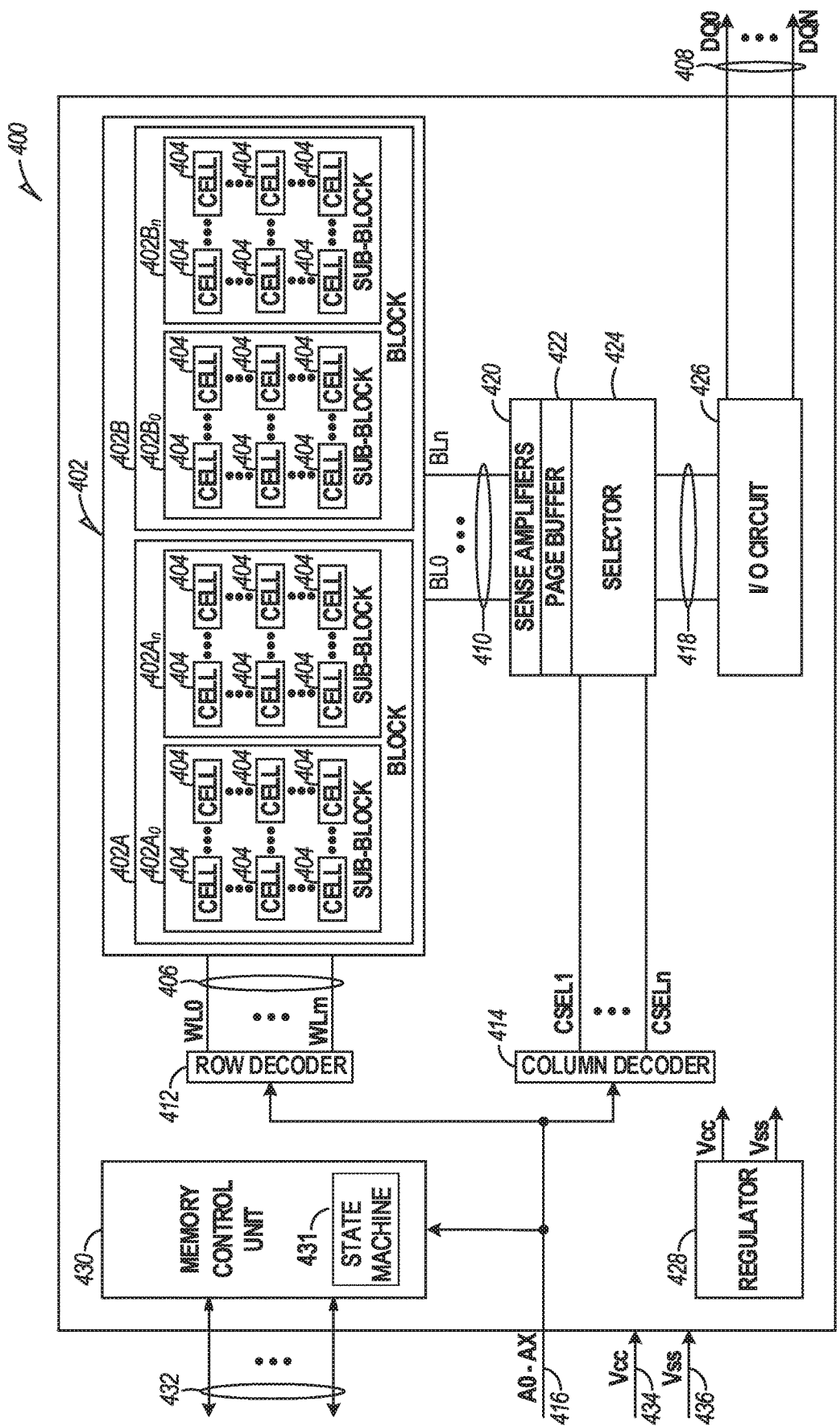
FIG. 4 is a block diagram illustrating an example of a memory module.

FIG. 4 is a block diagram illustrating an example of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The memory control unit 430 may include a state machine 431 coupled to the row decoder 412, the column decoder 414, and the I/O circuit 426. The state machine 413 can also output status data of the flash memory such as READY/BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418. In some examples a flash translation layer (not shown) can map addresses provided by a host to physical memory addresses used by the row decoder 412 and column decoder 414 to read data in the memory array 402.

The memory control unit 430 can receive positive and negative supply signals, such as a supply voltage Vcc 434 and a ground potential Vss 436, from an external source or supply (e.g., an internal or external battery, an AC-to-DC converter, etc.). In certain examples, the memory control unit 430 can include a regulator 428 to internally provide positive or negative supply signals.

As previously described, a memory cell of a memory device can be arranged as either an SLC configured to store only a single bit of data, or an MLC that stores two or more bits of data. For example, a triple-level cell (TLC) can store three bits of data per cell, and a quad-level cell (QLC) can store four bits of data per cell. Compared to MLC (e.g., TLC or QLC) storage, SLC cells generally store less data, and manufacturing memory devices in capacities suitable for use as a storage device using just SLC memory cells is less cost effective. However, SLC memory cells may offer better performance with higher reliability. For example, SLC cells may be written to with fewer programming cycles, thereby reducing the chances of corruption from an unexpected power loss during programming. A compromise solution to memory management is using an SLC cache, where some cells may be configured as SLC and other cells as MLC. For example, data may be first written to the SLC, and later transferred to the MLC when the memory device is not busy (e.g., idle state). In some examples, when receiving a host write request, the memory controller can check if there is free SLC cache. Data can then be written to the SLC cache if there is free SLC cache, or instead written to MLC storage directly if no free SLC cache is available. The SLC cache mechanism provides a balance between the speed and reliability of SLC memory cells with the storage capacity of MLC memory cells. In some example memory devices, the memory cells can be reconfigurable by firmware between SLC and MLC, and the cache size can vary during usage (dynamic size SLC cache). For example, the SLC cache size can vary based upon how full the memory device is (device utilization). As the device fills up, memory cells configured as SLC cache are migrated to MLC to increase total data storage capacity.

The use of SLC cache may lead to write amplification (WA) because same data is written twice to the physical media of the flash memory, first to the SLC cache and then to the MLC storage. A WA metric can be determined as the actual amount of information physically written to the storage media relative to the logical amount that a host intends to write over the life of that data as it moves throughout the memory device. The larger the SLC cache, the more likely a write request is to be serviced by SLC cache, hence the greater the likelihood of an increase in WA. In addition to the use of SLC cache, garbage collection (GC) may also lead to a large WA, as previously discussed.

The present document describes examples of methods, systems, memory devices, and machine-readable mediums which automatically tune GC operation and adjust SLC cache size based at least in part on a memory usage characteristic, such as an estimated device life expectancy indicated by a current device wear metric. The estimated device life expectancy may be represented by a wear-indicated device age. In accordance with said wear-indicated device age, GC aggressiveness may be increased or decreased, and memory cells can be configured or reconfigured between the SLC and the MLC.

By factoring in wear-indicated device life expectancy or device age as part of a determination of GC aggressiveness and a determination of an SLC cache size, the memory device can be better customized to the user workload, and an improved balance between device performance and device lifetime can be achieved. This contrasts with conventional GC process and/or SLC cache management that do not take into account the wear-indicated device life expectancy or device age. Considering the wear-indicated device life expectancy or device age when setting SLC cache size allows the memory device to increase the SLC cache to provide greater burst performance and a better user experience for light workload users, as the lighter workload generally corresponds to a wear-indicated device age less than actual device age, and the memory device is underused (e.g., with less usage of SLC cache and fewer GC operations). In such a case, more aggressive GC operations may be performed, and a larger SLC cache size may be maintained (e.g., by reducing memory cells reallocated from SLC cache to MLC storage), as such operations pose a low risk of the device wearing out prior to an expected device life. With majority of host writes going to SLC cache, SLC cache utilization is increased, WA can be maximized, and device performance and user experience can be improved. In contrast, a heavier workload generally corresponds to a wear-indicated device age greater than actual device age, indicating the device is overused. In such a case, fewer GC operations can be invoked, and the SLC cache size can be reduced such as by reallocating more SLC memory cells to MLC storage. With the majority of host data written directly to MLC storage, the total data written to the physical media can be reduced, and the life expectancy of the memory device can be extended.

Figure 5:
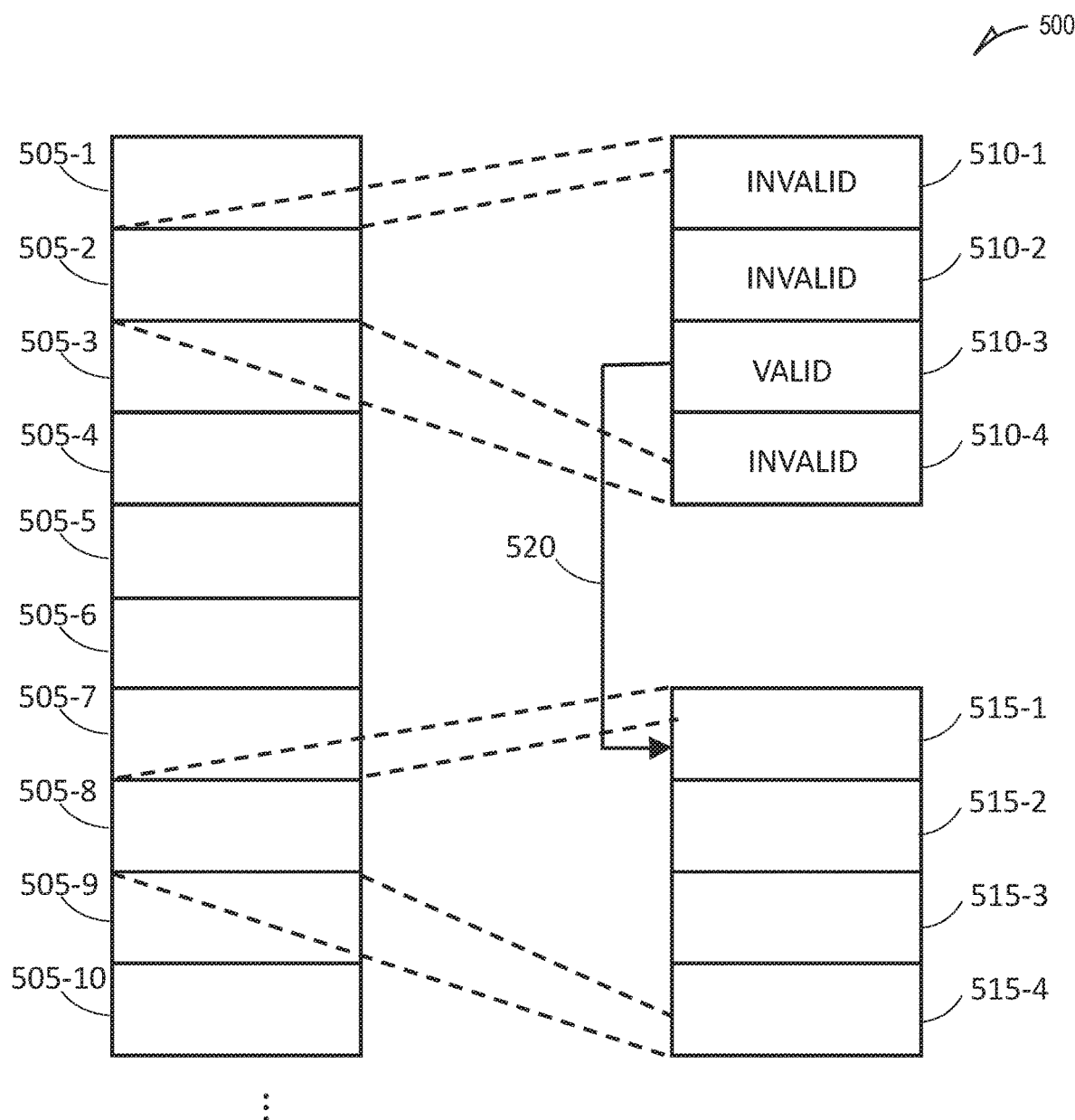
FIG. 5 is a diagram illustrating an example of a garbage collection (GC) process in a memory device.

FIG. 5 is a block diagram 500 illustrating an example of a garbage collection (GC) process in a memory device, such as an SSD. The GC process includes programming valid data from an erase block to another valid block. By way of example and not limitation, FIG. 5 shows blocks 505-1 through 505-10 in a memory device. Using 505-2 as an example, the block lock 505-2 is shown to include four pages 510-1 through 510-4, where pages 510-1, 510-2, and 510-4 are marked as invalid (meaning that it contains stale data, or garbage, marked for deletion), and page 510-3 is marked as valid (meaning that it stores valid data that needs to be preserved). A GC operation may target the block 505-2, by programming the valid data in page 510-3 to another block (different from block 505-2), such as block 505-8 which includes pages 515-1 through 515-4. As shown by dashed arrow 520 in FIG. 5, the valid data in page 510-3 may be programmed into page 515-1. After the valid data in page 510-3 is programmed into page 515-1, all the pages in block 505-2 are marked invalid, and the entire erase block 505-2 may be subject to GC. It should be noted that although ten blocks are shown in the memory device and four pages in block 505-2, the memory device may have any number of blocks, and each block may any number of pages.

Figure 6:
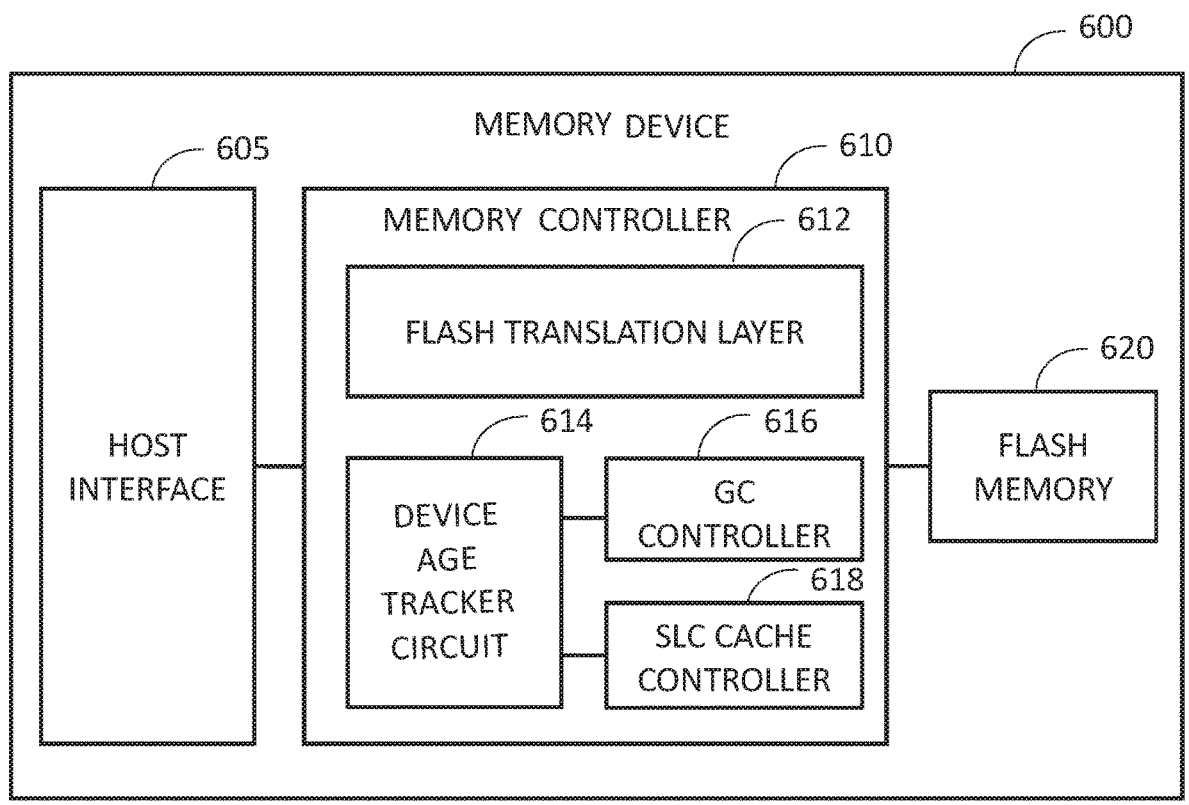
FIG. 6 is a block diagram illustrating an example of a memory device that may incorporate one or more embodiments of the invention as discussed in this document.

FIG. 6 is a block diagram illustrating an example of a memory device 600 that may incorporate one or more embodiments of the invention as discussed in this document. The memory device 600 may include any manner of non-transient storage device, such as a solid-state drive (SSD), a thumb drive, a memory card, or an embedded device storage, among others. In some examples, the memory device 600 may include non-volatile memory, such as flash memory (e.g., NAND flash memory), to store data. As illustrated in FIG. 6, the memory device 600 may include a host interface 605, a memory controller 610, and various flash memory 620 that may be organized into various channels. The host interface 605 manages communications between the memory device 600 and a machine such as a desktop or laptop computer, a server, a mobile device, among other devices. In an example, the memory device 600 may be configured as an SSD, in which case the host interface 605 may be compatible with standard hard drive data interfaces, such as Serial Advanced Technology Attachment (SATA), Small Computer System Interface (SCSI), Integrated Device Electronics (IDE), etc.

The memory controller 610 may perform various memory management functions described herein, including read, write, and erasure operations on the flash memory 620. The flash memory 620 may include circuitry that stores both user data and other data managed internally by the memory device. In some examples, the flash memory 620 may include one or more flash dies, each of which contains a portion of the total storage capacity of the flash memory 620. The dies may be stacked to lower cost compared to a single, monolithic die. The memory contained within an individual die may be partitioned into erasure blocks. An individual block may include a number of pages each containing an array of memory cells. A page represents the smallest portion of data that can be individually programmed or read. Each page may be in one of three states: free (currently not storing any data), valid (currently storing data), and invalid (previously storing valid data, but no longer storing valid data and not yet free). When new data is written to the flash memory, a free page is located, and the data written to that free page which is then marked as storing valid data. Pages are typically written in order within an erase block. An individual usually may not be overwritten. Therefore, when data stored in flash memory is to be changed by an application, the entire page containing the data is written to a new page, and the original page is marked as invalid. As such, the GC operation allows the memory device 600 (e.g., an SSD) to reclaim invalid pages at an erase block granularity. The pages in an erase block can be reset and marked as free once again.

The memory controller 610 may include one or more of a flash translation layer (FTL) 612, a device age tracker circuit 614, a garbage collection (GC) controller 616, and an SLC cache controller 618. The FTL 612 may translate the upper file system read and write commands and manage internal memory data layout for storage. The FTL 612 supports address translation, also known as logical to physical address mapping that changes logical address from the file system to physical address in flash memory. The FTL 612 may redirect each write request to an empty area of flash memory, thereby avoiding the "erase-before write" limitation of flash memory. Additionally, FTL 612 may assist in various memory management processes including GC, wear-leveling, bad block management, error control functions, among others. The FTL 612 may further provide power off recovery to save the FTL data structures and maintain data consistency in case of a sudden power-off during FTL operation.

By way of example and not limitation, two memory management functions are illustrated in FIG. 6, namely GC operation operated by the GC controller 616, and SLC cache configuration operated by the SLC cache controller 618. One or both of the GC operation and the SLC cache configuration may be adapted to a memory usage characteristic, such as a wear-indicated device life expectancy or device age that is produced by the device age tracker circuit 614. Various embodiments of GC control and SLC cache configuration adapted to the wear-indicated device life expectancy device age as discussed in this document may improve balanced memory device performance and device lifetime.

The device age tracker circuit 614 is configured to determine a wear-indicated device age or life expectancy based on a current wear metric of the device. The wear metric, which quantifies a degree of wear, may be estimated based on an amount of data physically written to the memory medium, such as NAND memories, with respect to a drive endurance of the memory device (e.g., total bytes writable to the memory device for the lifetime of the device). Evaluation of the wear metric and estimation of the wear-indicated device age or life expectancy may be performed continuously (e.g., after each host write or each NAND write), or periodically (e.g., at a specified time interval or according to a specified schedule). The device age tracker circuit 614 may determine whether the device is underused or overused by comparing the wear-indicated device age or life expectancy to an actual device age, which may be determined using an internal oscillator of the memory device or a real-time clock. Examples of the device age tracker circuit for assessing device wear and determining a wear-indicated device age or life expectancy are discussed below, such as with reference to FIG. 7.

The GC controller 616 may initiate or adjust the GC operation based at least on the wear-indicated device age or life expectancy provided by the device age tracker circuit 614. The GC process may be initiated during an idle state of the memory device (e.g., no active I/O access of the memory cells like read or write commands for the host). In an example, if the actual device age exceeds the wear-indicated device age by a specified margin, then the device age tracker circuit 614 determines that the memory device is ahead of target usage, and the GC controller 616 may take an aggressive stance to increase the GC operation, such as by increasing GC speed, frequency, time duration, or a number of erase blocks targeted for GC operations. Conversely, if the actual device age is less than the wear-indicated device age by a specified margin, then the memory device is determined to be behind the target usage. The GC controller 616 may then take a conservative stance to decrease the GC operation, such as by decreasing GC speed, frequency, time duration, or a number of erase blocks targeted for GC operations. When the GC controller 616 is invoked to erase an erase block (e.g., the erase block 505-2 of FIG. 5), assuming there is valid data 510-3 of FIG. 5 in the erase block, then the GC controller 616 may generate a write request. When the write request is processed, valid data 510-3 may be written to a new page 515-1. Once the write request has been submitted for processing, the GC controller 616 may erase the block with invalid data (e.g., the block 505-2 of FIG. 5). In various example, the adaptive tuning of GC aggresiveness can be used in discretionary GC operations, when there is still free memory space available in the device memory for host write.

The GC process adapted to wear-indicated device age or life expectancy as discussed above (hereinafter the "device age-adapted GC process"), may be triggered by a trigger event. In an example, the GC controller 616 may trigger the device age-adapted GC process when the actual device age exceeds an age threshold. A non-limiting example of the age threshold is approximately 3 months from the first host write of the memory device. The device age may alternatively be measured by actual cumulative P/E cycles. The P/E cycle occurs whenever data is stored in flash memory. Maximum number of P/E cycles for the given flash architecture, known as flash cell endurance, is an indication of device life expectancy. The GC controller 616 may trigger the device age-adapted GC process if the actual cumulative P/E cycles exceed a P/E cycle threshold (e.g., approximately 1000 PE cycles in a non-limiting example). In some examples, the GC controller 616 may track a host write count, and trigger the device age-adapted GC process when the cumulative host write count exceeds a host-bytes threshold. In some examples, the GC controller 616 may track a physical write count (amount of date written to the physical media), and trigger the device age-adapted GC process when the cumulative physical write count exceeds a byte count threshold. Using a trigger event to delay the invocation of device age-adapted GC process, either by device age or by total bytes written as discussed above, may improve system performance and user experience during an early age of the memory device when the cumulative host workload is generally lighter and there is a lower risk of device wearing out.

The SLC cache controller 618 may be configured to control the availability of SLC cache to improve user experience and performance. The SLC cache controller 618 may set a dynamic SLC cache size, such as by reconfiguring one or more memory cells between SLC and MLC. The SLC cache reconfiguration may be based on one or more metrics of the memory device, such as device utilization, free memory available, memory used, or write amplification, among others. FIG. 6 illustrates a dynamic SLC cache size determination adapted to the wear-indicated device age or life expectancy. The SLC cache controller 618 may reallocate a portion of the group of memory cells between SLC cache and MLC storage (e.g., TLC or QLC). In an example, the SLC cache controller 618 may determine an amount of memory cell reallocation, as well as when to initiate said reallocation, based at least on the wear-indicated device age or life expectancy. For example, the device age tracker circuit 614 can determine whether the memory device is ahead of, or behind, a target usage requirement using a comparison of the actual device age and the wear-indicated device age, as previously discussed. If the memory device is ahead of the target usage, then the SLC cache controller 618 can maintain a substantial pool of free blocks in the SLC cache, and reduce the reallocation of memory cells in the SLC cache to MLC storage. If the memory device is behind the target usage, then the SLC controller 618 can maintain a shallow pool of free blocks in the SLC cache, and increase the reallocation of memory cells in the SLC cache to MLC storage. Such memory cell reallocation between SLC cache and MLC storage can help ensure that the device lifetime requirement be met without substantially compromising device performance and user experience.

Figure 7:
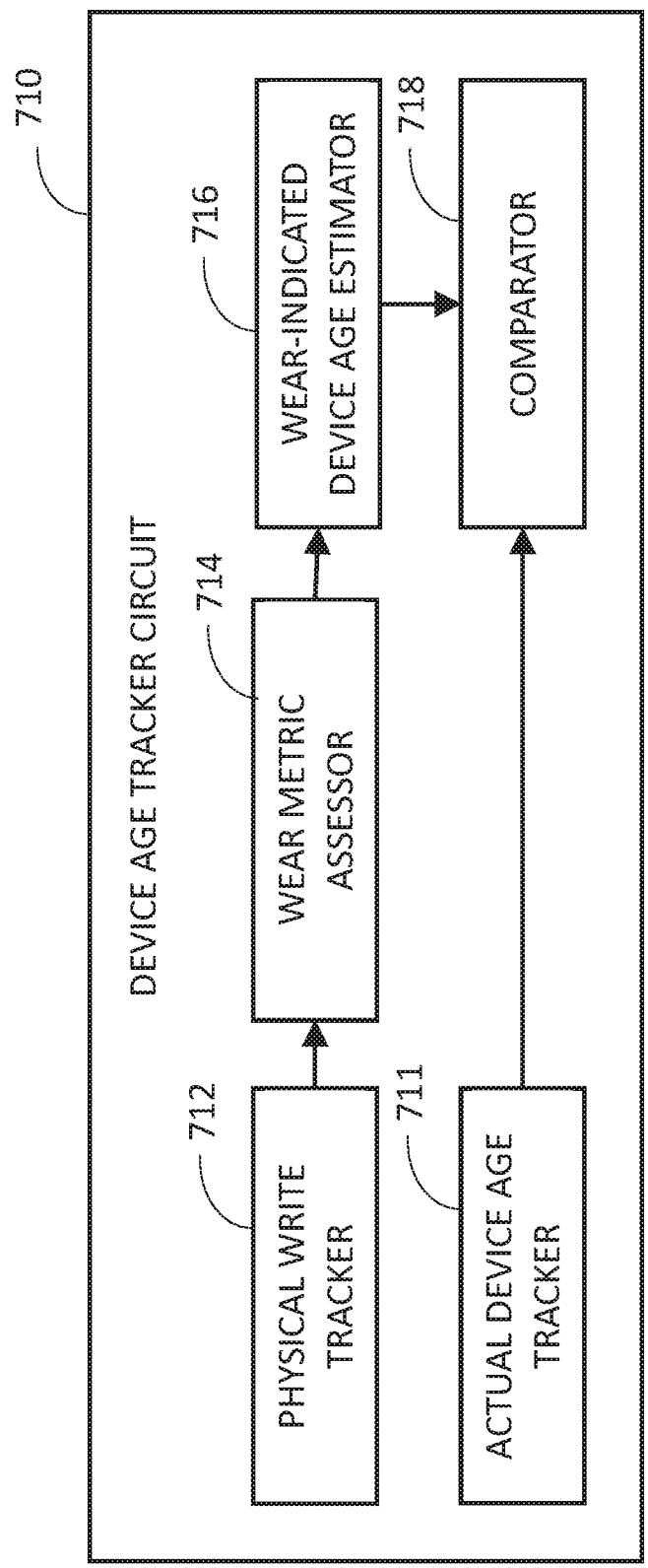
FIG. 7 is a block diagram illustrating an example of a device age tracker circuit for tracking a wear-indicated device age or life expectancy.

FIG. 7 is a block diagram illustrating an example of a device age tracker circuit 710 for tracking a wear-indicated device age or life expectancy. The device age tracker circuit 710 is an embodiment of the device age tracker circuit 614 of FIG. 6. The wear-indicated device age may indicate memory device utilization, such as a light workload that corresponds to memory underuse, or a heavy workload overused that corresponds to memory overuse. GC aggressiveness and/or SLC cache size may be adjusted in accordance with the wear-indicated device age or life expectancy. For example, in case of a lighter workload or an indication of memory underuse, more aggressive GC operations may be performed, and a larger SLC cache size may be maintained (e.g., by decreasing reallocation of memory cells in the SLC cache to MLC storage). In contrast, in case of a heavier workload or an indication of memory overuse, more conservative GC operations are performed, and a smaller SLC cache size can be maintained (e.g., by increasing reallocation of memory cells in the SLC cache to MLC storage).

The device age tracker circuit 710 may be implemented as a part of a microprocessor circuit, which may be a dedicated processor such as a digital signal processor, application specific integrated circuit (ASIC), microprocessor, or other type of processor for processing information including physical activity information. Alternatively, the microprocessor circuit may be a processor that may receive and execute a set of instructions of performing the functions, methods, or techniques described herein.

The device age tracker circuit 710 may include circuit sets comprising one or more other circuits or sub-circuits, such as an actual device age tracker 711, a physical write tracker 712, a wear metric assessor 714, a wear-indicated device age estimator 716, and a comparator 718. These circuits may, alone or in combination, perform the functions, methods, or techniques described herein. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

The actual device age tracker 711 may include an internal oscillator of the memory device or a real-time clock to track actual device age Y(t) at time 't'. The actual device age may be measured from the first use of the memory device (e.g., first memory write). The physical write tracker 712 may determine continuously, or periodically at a specified interval or schedule, a total physical write count representing an amount of data physically written to the memory cells (e.g., NAND flash memory), also referred to as total NAND bytes written $M_{NAND}$. $M_{NAND}$ may be a cumulative count of bytes written until present actual device age determined by the actual device age tracker 711. In an example, the physical write tracker 712 may track a write amplification (WA) metric, and an actual cumulative amount of data $N_{Host}$ requested by a host to write to the memory cells. Both the WA metric and $N_{Host}$ may be tracked continuously or periodically. The physical write tracker 712 may determine the total NAND bytes written $M_{NAND}(t)$ until time 't', using the tracked WA(t) and $N_{Host}(t)$ as follows:

$$M_{NAND}(t) = N_{Host}(t) * WA(t) \quad (1)$$

The wear metric assessor 714 may use $M_{NAND}(t)$ to estimate a device wear metric ω(t), represented by a ratio of $M_{NAND}(t)$ to an SSD endurance. The SSD endurance is the total amount of data that can be written to the memory device (e.g., SSD), and can be measured as terabytes written (TBW), the total data amount that can be written to the physical media during device's lifespan. That is, the device wear metric ω(t) can be determined using Equation (Eq.) 2 below:

$$\omega(t) = M_{NAND}(t) / TBW \quad (2)$$

The TBW may be determined using a flash cell endurance and a drive capacity:

$$TBW = \text{Drive capacity} * \text{Flash cell endurance} \quad (3)$$

where the flash cell endurance represents the number of P/E cycles an individual memory cell can be written before the cell becomes unreliable. The drive capacity can be computed as a product of a number of blocks for user data and size of block.

The wear-indicated device age estimator 716 may then determine a wear-indicated device age $Y_{Exp}(t)$ that corresponds to the presently determined wear metric $\omega(t)$ using Eq. 4 below:

$$Y_{Exp}(t) = \text{Device Warranty} * 365 \text{ days} * \omega(t) \quad (4)$$

where the device warranty is a manufacturer-specified device lifetime in years (e.g., 3-5 years).

The comparator 718 can compare the wear-indicated device age $Y_{Exp}(t)$ to the tracked actual device age $Y(t)$ to determine whether the memory device is underused or overused relative to target usage. For example, the memory device is determined to be ahead of target usage (underused) if the actual device age exceeds the wear-indicated device age, or that the memory device is determined to be behind the target usage (overused) if the actual device age is less than the wear-indicated device age by a specified margin. If the memory device is ahead of the target usage, the GC controller 616 may initiate or increase the GC operation, and the SLC cache controller may maintain a large SLC cache size for the user. If the memory device is behind the target usage, the GC controller 616 may withhold or decrease the GC operation, and the SLC cache controller may reduce the SLC cache size, increase reallocation of memory cells in the SLC cache to MLC storage.

An example of using the device age tracker circuit 710 to track a wear-indicated device age and determines device underuse/overuse is given as follows. At a certain checkpoint in time 'T' during the physical write tracking process, the device age tracker circuit 710 may determine the actual cumulative host writes $N_{Host}(T)$ is 15 terabytes (TB), and the tracked write amplification at time T is WA(T)=2.6. The physical write tracker 712 may then determine the total physical data written to the NAND array to be $M_{NAND}(T)$ =39 TB, according to Eq. 1. To determine the SSD endurance or the TBW, assume there are 1000 blocks for user area, each block is 64 megabytes (MB) in storable size, and each block will guarantee at least 3000 P/E cycles, then the total endurance is TBW=1000 blocks*64 MB/block*3000 P/E=192 TB. The wear metric assessor 714 can then determines a wear metric, according to Eq. 2, to be $\omega(T)$=39 TB/192 TB=16.7%. Further assume the device warranty lifetime is three years, then the wear-indicated device age estimator 716 may determine a wear-indicated device age using Eq. 4, as $Y_{Exp}(T)$=3 years*365 days*16.7%=182. That is, to hit the wear level of $\omega(T)$=16.7%, the device age would be 182 days. On the other hand, at time 'T', assume that the device age tracker 711 indicates (e.g., using a system oscillator or a real-time clock) that the actual current device age is 150 days (from the first use of the device). As actual device age (150 days) is less than the wear-indicated device age (182 days), the memory device is determined to be behind the target usage. The device is determined to be overused and wear fast. The GC controller 616 may reduce GC speed, frequency, time duration, or a number of erase blocks targeted for GC operations, to slow down memory device wear-out. The SLC controller 618 may reduce the SLC cache size, such as by increasing memory cell reallocation to MLC storage.

In contrast, if the device age tracker 711 indicates the actual current device age is 200 days, which is greater than the wear-indicated device age (182 days), then memory device is determined to be ahead of the target usage (by approximately 18 days). The device is determined to be underused, and has sufficient wear left. The GC controller 616 may increase GC rate, frequency, time duration, or a number of erase blocks targeted for GC operations. The SLC cache controller 618 may maintain a large amount of free blocks in the SLC cache, and reduce reallocation of SLC cache cells to MLC storage. This may provide a user with an optimal device performance and user experience without a significant risk of running out of endurance.

Figure 8:
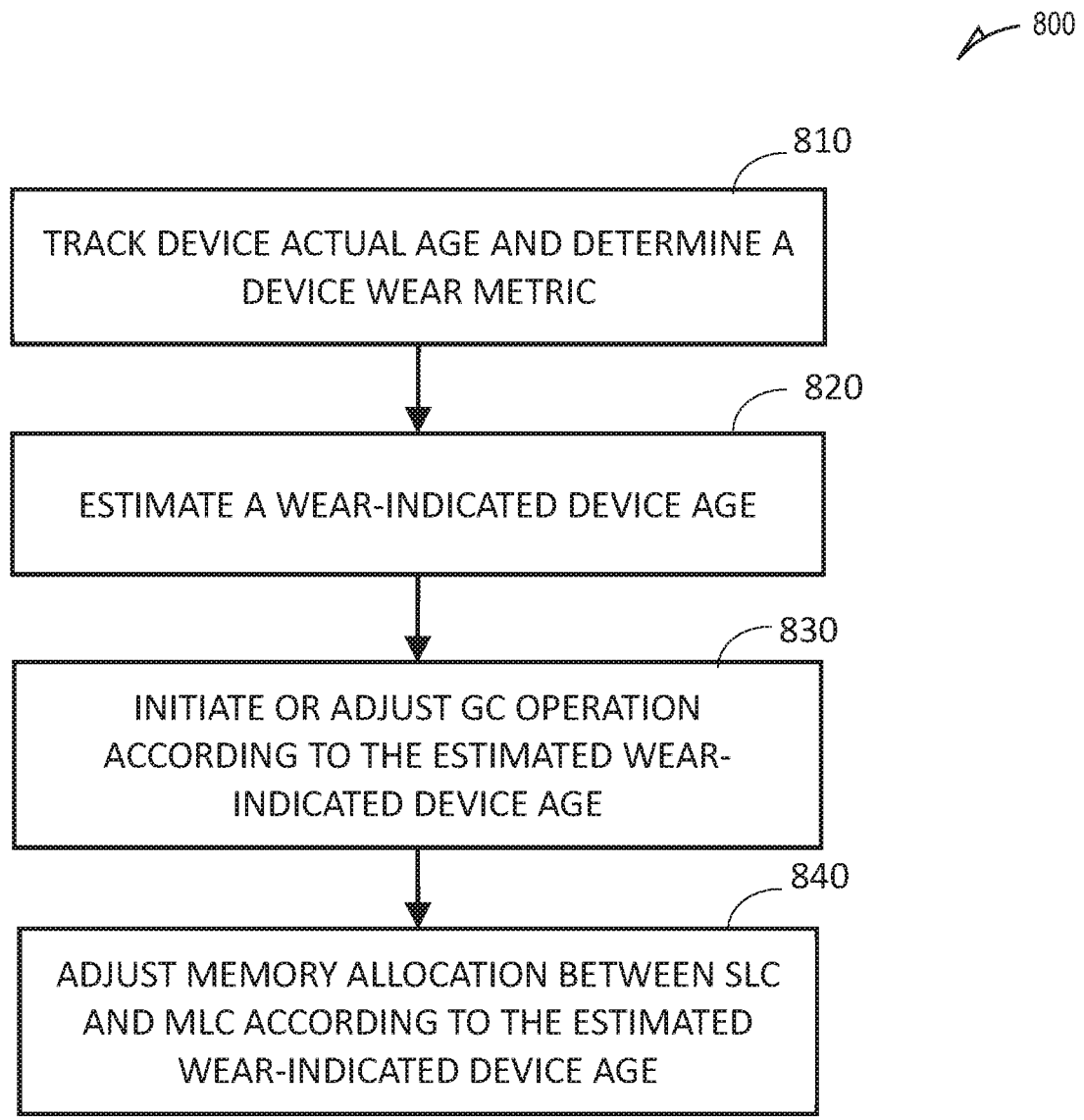
FIG. 8 is a flow chart illustrating another method of optimizing memory utilization in a memory device based at least on memory usage characteristic, such as an estimated device life expectancy or wear-indicated device age.

FIG. 8 is a flow chart illustrating another method 800 of optimizing memory utilization in a memory device based at least on memory usage characteristic, such as an estimated device life expectancy or wear-indicated device age, according to some examples discussed in the present document. The method 800 may be implemented in and executed by memory controller 610, or embodiments or variants thereof. Although the blocks in the method 800 are shown in a particular order, the order of these steps can be modified. Thus, the illustrated embodiments can be performed in a different order, and some actions/blocks may be performed in parallel (e.g., blocks 830 and 840 can be performed in parallel). Additionally, one or more actions/blocks (e.g., one of the blocks 830 or 840) can be omitted in various embodiments.

At 810, an actual device age may be tracked, such as by using the actual device age tracker 711, and a device wear metric $\omega(t)$ may be determined, such as by the device age tracker circuit 614 or the wear metric assessor 714, as illustrated in FIGS. 6-7. The wear metric $\omega(t)$ characterizes a degree of wear, and may be estimated based on the amount of data physically written to the memory medium (e.g., NAND memories) relative to a drive endurance of the memory device (e.g., total bytes writable to the memory device for the lifetime of the device). The device wear metric $\omega(t)$ may be calculated as a ratio of $M_{NAND}(t)$ to an SSD endurance, as given in Eqs. 2 and 3 above.

At 820, a wear-indicated device age $Y_E(t)$, corresponding to the wear metric $\omega(t)$ at 810, may be estimated, such as using the wear-indicated device age estimator 716. In an example, the wear-indicated device age $Y_{Exp}(t)$ may be calculated using the wear metric $\omega(t)$ and a device warranty in years, such as according to Eq. 4 above. Evaluation of the wear metric at 910 and estimation of wear-indicated device age or life expectancy at 920 may be performed continuously (e.g., after each host write or each NAND write), or periodically (e.g., at a specified interval or according to a specified schedule).

At 830, a GC operation may be initiated or adjusted based at least on the wear-indicated device age or life expectancy. The GC process may be initiated during an idle state of the memory device (no active I/O access of the memory cells). Portions of a GC process are discussed previously with reference to FIG. 5. For an identified erase block (e.g., the erase block 505-2 of FIG. 5), upon processing of a write request, valid data 510-3 in the erase block 505-2 may be written to a new page 515-1, and the entire block 505-2 containing the invalid data is erased.

The wear-indicated device age or life expectancy may indicate a level of workload, such as a light workload that corresponds to memory underuse, or a heavy workload overused that corresponds to memory overuse. At 830, GC aggressiveness may be adjusted in accordance with the workload or memory underuse/overuse. For example, in case of a lighter workload or memory underuse state, more aggressive GC operations may be performed. In contrast, in case of a heavier workload or memory overuse state, more conservative (e.g., fewer) GC operations can be performed. Examples of tuning GC according to the wear-indicated device age or life expectancy are discussed below, such as with reference to FIG. 9.

At 840, availability of SLC cache, or a SLC cache size, may be adjusted based at least in part on the wear-indicated device age or life expectancy, such as using the SLC cache controller 618. SLC cache size may be dynamically tuned by reconfiguring one or more memory cells between SLC and MLC. Based on the wear-indicated device age or life expectancy, it may be determined whether the memory device is ahead of, or behind, a target usage requirement. If the memory device is ahead of the target usage, then more free blocks in the SLC cache can be maintained. Reallocation of memory cells in the SLC cache to MLC storage can be reduced. If the memory device is behind the target usage, then fewer free blocks in the SLC cache are maintained. More memory cells in the SLC cache can be reallocated to MLC storage. Such a dynamic SLC cache size determined in accordance with the wear-indicated device age or life expectancy can help ensure that the device lifetime requirement be met without substantially compromising the device performance and user experience.

Figure 9:
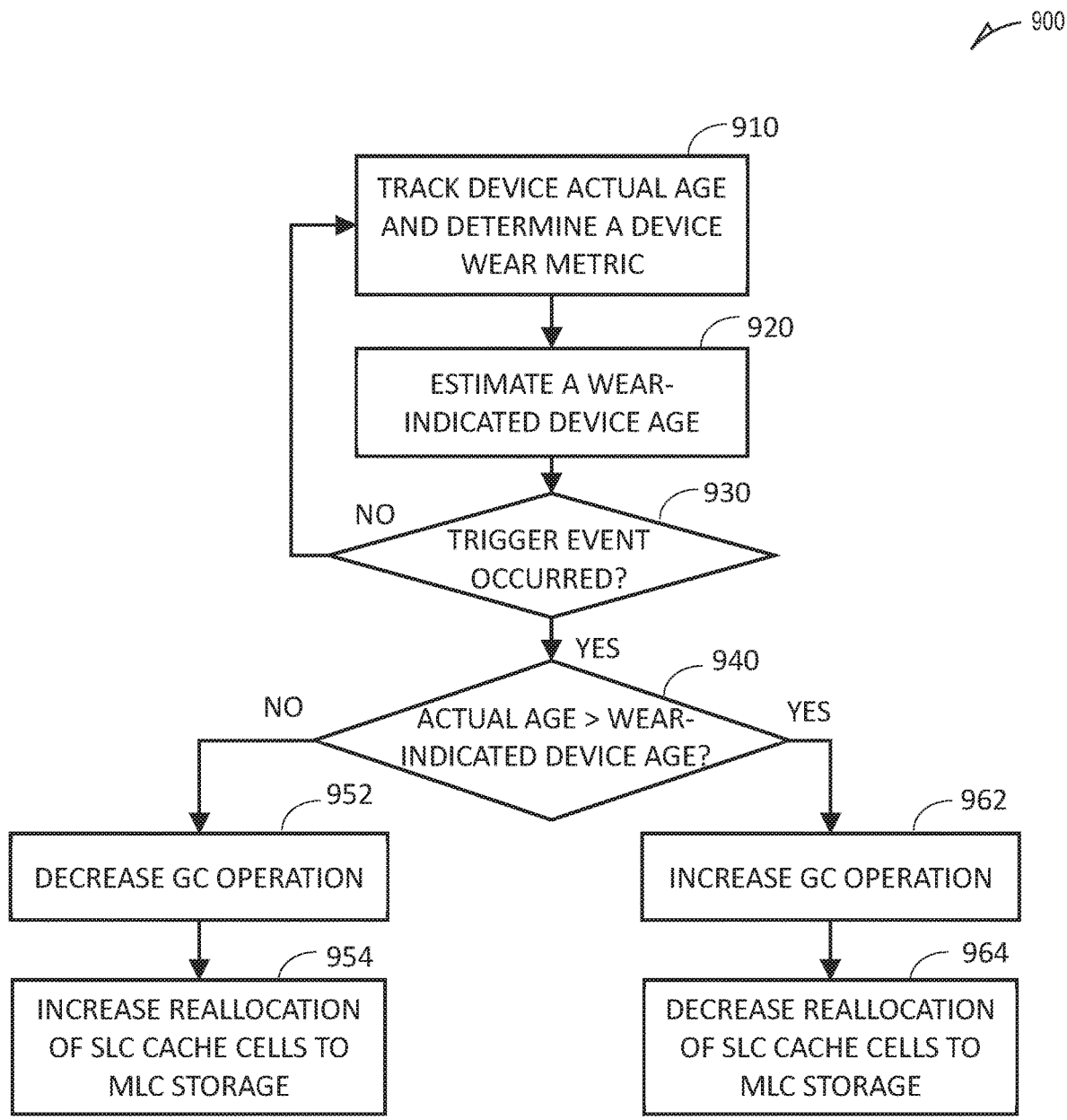
FIG. 9 is a flow chart illustrating another method of optimizing memory utilization in a memory device based at least on a wear-indicated device age or life expectancy.

FIG. 9 is a flow chart illustrating another method 900 of optimizing memory utilization in a memory device based at least on a wear-indicated device age or life expectancy, according to some examples discussed in the present document. The method 900 is an example of the method 800, and may be implemented in and executed by the memory controller 610, or embodiments or variants thereof.

As in FIG. 8, at 910, an actual device age may be tracked, and a device wear metric may be determined. A wear-indicated device age may be estimated at 920, such as using the device age tracker circuit 614 or its variant 710. At 930, a trigger event is detected. Occurrence of a trigger even may trigger the GC tuning process (e.g., increase or decrease the GC), and/or memory cell allocation between SLC cache and MLC storage. In an example, the trigger event may include an actual device age exceeding an age threshold (e.g., 3 months from the first host write). Alternatively, the actual device age may be measured using actual cumulative P/E cycles, and the trigger event is the actual cumulative P/E cycles exceeding a P/E cycle threshold (e.g., 1000 P/E cycles). In another example, the trigger event may include a cumulative host write count $N_{Host}$ exceeding a byte count threshold, or a cumulative physical write count $M_{NAND}$ exceeds a byte count threshold. Using a trigger event to delay the invocation of GC process may improve system performance and user experience during an early age of the memory device.

If a trigger event is detected, then at 940, the wear-indicated device age may be compared to an actual device age. If the actual device age is less than the wear-indicated device age by a specified margin, then the memory device is determined to be behind the target usage, or the memory is overused. Then, at 952, the GC operation may be reduced, such as by decreasing GC speed, frequency, time duration, or a number of erase blocks targeted for GC operations. Additionally or alternatively, at 954, the SLC cache size may be reduced, and more memory cells in the SLC cache may be reallocated to the MLC storage. Such a conservative GC operation and favorable use of direct MLC may reduce WA and extend device lifetime to meet required endurance without substantially compromising memory performance and user experience.

If it is determined at 940 that the actual device age is greater than the wear-indicated device age by a specified margin, the memory device is determined to be ahead of the target usage, or the memory is underused. Then, at 962, the GC operation may be increased, such as by increasing GC speed, frequency, time duration, or a number of erase blocks targeted for GC operations. Additionally or alternatively, at 964, the SLC cache size may be increased, and less memory cells in the SLC cache may be reallocated to the MLC storage. Such an aggressive GC operation and maintenance of a large SLC cache with free blocks may help optimize memory performance when the user does use the device, with little risk of sacrificing device lifetime because of the indication of memory underuse.

Figure 10:
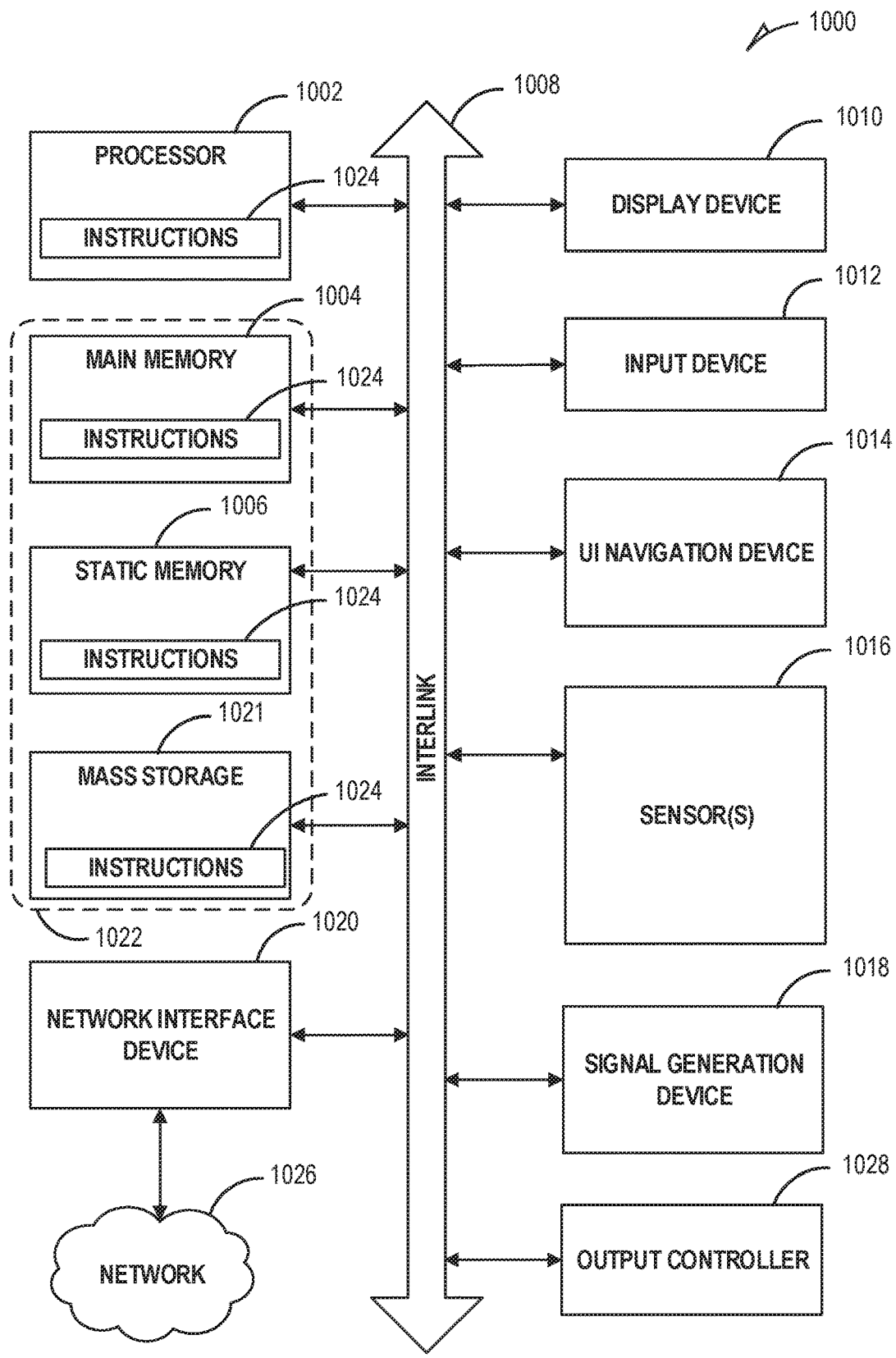
FIG. 10 is a block diagram illustrating an example of a machine upon which one or more embodiments may be implemented.

FIG. 10 illustrates a block diagram of an example machine 1000 upon which any one or more of the techniques (e.g., methodologies) discussed herein may perform. In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1000 (e.g., the host device 105, the memory device 110, etc.) may include a hardware processor 1002 (e.g., a central processing unit (CPU), a graphics processing unit (GPU), a hardware processor core, or any combination thereof, such as the memory controller 115, etc.), a main memory 1004 and a static memory 1006, some or all of which may communicate with each other via an interlink (e.g., bus) 1008. The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1000 may include a machine readable medium 1022 on which is stored one or more sets of data structures or instructions 1024 (e.g., software) embodying or utilized by any one or more of the techniques or functions described herein. The instructions 1024 may also reside, completely or at least partially, within the main memory 1004, within static memory 1006, or within the hardware processor 1002 during execution thereof by the machine 1000. In an example, one or any combination of the hardware processor 1002, the main memory 1004, or the static memory 1006 may constitute the machine readable medium 1022.

While the machine readable medium 1022 is illustrated as a single medium, the term "machine readable medium" may include a single medium or multiple media (e.g., a centralized or distributed database, or associated caches and servers) configured to store the one or more instructions 1024.

The term "machine readable medium" may include any medium capable of storing or encoding instructions for execution by the machine 1000 and that cause the machine 1000 to perform any one or more of the techniques of the present disclosure, or capable of storing, encoding or carrying data structures used by or associated with such instructions. Non-limiting machine-readable medium examples include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1024 (e.g., software, programs, an operating system (OS), etc.) or other data are stored on the storage device 1021, can be accessed by the memory 1004 for use by the processor 1002. The memory 1004 (e.g., DRAM) is typically fast, but volatile, and thus a different type of storage than the storage device 1021 (e.g., an SSD), which is suitable for long-term storage, including while in an "off" condition. The instructions 1024 or data in use by a user or the machine 1000 are typically loaded in the memory 1004 for use by the processor 1002. When the memory 1004 is full, virtual space from the storage device 1021 can be allocated to supplement the memory 1004; however, because the storage 1021 device is typically slower than the memory 1004, and write speeds are typically at least twice as slow as read speeds, use of virtual memory can greatly reduce user experience due to storage device latency (in contrast to the memory 1004, e.g., DRAM). Further, use of the storage device 1021 for virtual memory can greatly reduce the usable lifespan of the storage device 1021.

In contrast to virtual memory, virtual memory compression (e.g., the Linux® kernel feature "ZRAM") uses part of the memory as compressed block storage to avoid paging to the storage device 1021. Paging takes place in the compressed block until it is necessary to write such data to the storage device 1021. Virtual memory compression increases the usable size of memory 1004, while reducing wear on the storage device 1021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1024 may further be transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1000, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second." and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a memory device comprising a group of memory cells and a memory controller. The memory controller includes a device age tracker circuit and a garbage collection (G) controller. The device age tracker circuit can be configured to: track an actual device age, and determine a device wear metric using a physical write count and total writes over an expected lifetime of the memory device, the physical write count representing an amount of data physically written to the memory cells accumulated over the tracked actual device age; and estimate a wear-indicated device age in accordance with the determined device wear metric. The GC controller can be configured to adjust an amount of memory space to be freed by a GC operation on a portion of the group of the memory cells according to the estimated wear-indicated device age relative to the tracked actual device age.

In Example 2, the subject matter of Example 1 optionally includes the GC controller that can be configured to generate a control signal to initiate a discretionary GC operation when there is free memory space in the device memory available for host write.

In Example 3, the subject matter of any one or more of Examples 1-2 optionally includes the device age tracker circuit that can be configured to track a host write count representing an amount of data requested by a host to write to the memory cells; track a write amplification metric, and to determine the physical write count using the tracked total host write count and the tracked write amplification.

In Example 4, the subject matter of any one or more of Examples 1-3 optionally includes the device age tracker circuit that can be configured to estimate the wear-indicated device age using the expected lifetime of the memory device and the determined device wear metric.

In Example 5, the subject matter of any one or more of Examples 1-4 optionally includes the GC controller that can be configured to adjust the amount of memory space to be freed by a GC operation using a comparison of the estimated wear-indicated device age to the actual device age.

In Example 6, the subject matter of Example 5 optionally includes the device age tracker circuit that can be configured to track the actual device age using an internal oscillator of the memory device or a real-time clock.

In Example 7, the subject matter of any one or more of Examples 5-6 optionally includes the GC controller that can be configured to increase the amount of memory space to be freed by a GC operation if the actual device age exceeds the wear-indicated device age by a specified margin, and withhold a GC operation or decrease the amount of memory space to be freed by a GC operation if the actual device age is less than the wear-indicated device age by a specified margin.

In Example 8, the subject matter of any one or more of Examples 1-7 optionally includes a single level cell (SLC) cache controller configured to adjust a size of an SLC cache, including a reallocation of a portion of the memory cells between the SLC cache and a multi-level cell (MLC) storage, according to the estimated wear-indicated device age relative to the tracked actual device age.

In Example 9, the subject matter of Example 8 optionally includes the SLC cache controller that can be configured to increase the SLC cache size, including reduce the reallocation of memory cells in the SLC cache to the MLC storage if the actual device age exceeds the wear-indicated device age by a specified margin, or reduce the SLC cache size, including increase the reallocation of memory cells in the SLC cache to the MLC storage if the actual device age is less than the wear-indicated device age by a specified margin.

In Example 10, the subject matter of any one or more of Examples 3-9 optionally includes the memory cells allocated as the MLC storage that can store three or more bits of data per memory cell.

In Example 11, the subject matter of any one or more of Examples 1-10 optionally includes the workload tracker circuit that can be configured to determine the device wear metric and to estimate the wear-indicated device age continuously or periodically.

In Example 12, the subject matter of any one or more of Examples 1-11 optionally includes the GC controller that can be configured to initiate a GC operation in response to a trigger event including at least one of: an actual device age exceeding an age threshold; an actual cumulative host write count exceeding a byte count threshold; or an actual cumulative physical write count exceeding a byte count threshold.

In Example 13, the subject matter of any one or more of Examples 1-12 optionally includes the memory device that can be a solid state drive (SSD) device including NAND flash memories.

Example 14 is a method of optimizing memory utilization in a memory device via a memory controller. The method comprises steps of: tracking an actual device age; determining a device wear metric using a physical write count and total writes over an expected lifetime of the memory device, the physical write count representing an amount of data physically written to memory cells of the memory device accumulated over the tracked actual device age; estimating a wear-indicated device age in accordance with the determined device wear metric; and adjusting an amount of memory space to be freed by a garbage collection (GC) operation on a portion of the memory cells according to the estimated wear-indicated device age relative to the tracked actual device age.

In Example 15, the subject matter of Example 14 optionally includes adjusting the memory space to be freed by a GC operation that can include steps of: increasing the amount of memory space to be freed by a GC operation if the actual device age exceeds the wear-indicated device age by a specified margin; and withholding the GC operation or decreasing the amount of memory space to be freed by a GC operation if the actual device age is less than the wear-indicated device age by a specified margin.

In Example 16, the subject matter of any one or more of Examples 14-15 optionally includes, based at least on the estimated wear-indicated device age, adjusting a size of a single-level cell (SLC) cache including adjusting reallocation of a portion of the memory cells between the SLC cache and a multi-level cell (MLC) storage.

In Example 17, the subject matter of Example 16 optionally includes adjusting the SLC cache size that can includes steps of increasing the SLC cache size, including reducing the reallocation of memory cells in the SLC cache to the MLC storage if the actual device age exceeds the wear-indicated device age by a specified margin, or reducing the SLC cache size, including increasing the reallocation of memory cells in the SLC cache to the MLC storage if the actual device age is less than the wear-indicated device age by a specified margin.

In Example 18, the subject matter of any one or more of Examples 14-17 optionally includes determining the physical write count using a host write count and a write amplification, and wherein determining the device wear metric can include using the physical write count and an endurance metric of the memory device.

In Example 19, the subject matter of any one or more of Examples 14-18 optionally includes estimating the wear-indicated device age that can include using the expected lifetime of the memory device and the determined device wear metric.

In Example 20, the subject matter of any one or more of Examples 14-19 optionally include detecting a trigger event, and initiating a GC operation in response to the detection of the trigger event, wherein the trigger event includes at least one of: the actual device age exceeding an age threshold; an actual cumulative host write count exceeding a byte count threshold; or an actual cumulative physical write count exceeding a byte count threshold.

In Example 21, any of the memory devices of Examples 1-13 may be adapted and operated to perform operations in accordance with any of the methods of Examples 14-20.

In Example 22, any of the memory devices of Examples 1-13 may be incorporated into an electronic system further comprising further comprising a host processor and a communication bus extending between the host processor and the memory device.

In Example 23, any of the memory devices of Examples 1-13 may be modified to include any structure presented in another of Examples 1-13.

In Example 24, any of the methods of Examples 14-20 may be performed by an electronic system including a host processor and a communications bus extending between the host processor and a memory device.

In Example 25, any of the methods of Examples 14-20 may be modified to include operations set forth in any other of Examples 14-20.

In Example 26, any of the memory devices of Examples 1-13 and 21-23 may further include a machine-readable storage device configured to store instructions as a physical state, wherein the instructions may be used to perform one or more operations of the memory device.

In Example 27, any of the methods of Examples 14-20, 24, and 25 may be implemented at least in part through use of instructions stored as a physical state in one or more machine-readable storage devices.

The invention claimed is:

1. A memory device, comprising:
a group of memory cells; and
a memory controller, including:
a device age tracker circuit configured to:
track an actual device age of the memory device from an initial memory write operation, and determine a device wear metric using a physical write count and total writes over an expected lifetime of the memory device, the physical write count representing an amount of data physically written to the memory cells accumulated over the tracked actual device age; and
estimate a wear-indicated device age of the memory device in accordance with the determined device wear metric; and
a garbage collection (GC) controller configured to compare the estimated wear-indicated device age to the tracked actual device age, and to adjust an amount of memory space to be freed by a GC operation on a portion of the group of the memory cells based on the comparison between the estimated wear-indicated device age and the tracked actual device age.

2. The memory device of claim 1, wherein the GC controller is configured to generate a control signal to initiate a discretionary GC operation when there is free memory space in the device memory available for host write.

3. The memory device of claim 1, wherein the device age tracker circuit is configured to:
track a host write count representing an amount of data requested by a host to write to the memory cells;
track a write amplification metric; and
determine the physical write count using the tracked host rite count and the tracked write amplification.

4. The memory device of claim 1, wherein the device age tracker circuit is configured to estimate the wear-indicated device age using the expected lifetime of the memory device and the determined device wear metric.

5. The memory device of claim 1, wherein the device age tracker circuit is configured to determine whether the memory device is underused or overused with respect to a target use based on the comparison between the wear-indicated device age and the tracked actual device age.

6. The memory device of claim 1, wherein the device age tracker circuit, is configured to track the actual device age using an internal oscillator of the memory device or a real-time clock.

7. The memory device of claim 1, wherein the GC controller is configured to:
increase the amount of memory space to be freed by a GC operation if the actual device age exceeds the wear-indicated device age by a specified margin; or
withhold a GC operation or decrease the amount of memory space to be freed by a GC operation if the actual device age is less than the wear-indicated device age by a specified margin.

8. The memory device of claim 1, further comprising a single level cell (SLC) cache controller configured to adjust a size of an SLC cache by reallocating a portion of the memory cells from the SLC cache to a multi-level cell (MLC) storage based on the comparison between the estimated wear-indicated device age and the tracked actual device age.

9. The memory device of claim 8, wherein the SLC cache controller is configured to:
reduce the amount of memory cells reallocated from the SLC cache to the MLC storage if the actual device age exceeds the wear-indicated device age by a specified margin; or
increase the amount, of memory cells reallocated from the SLC cache to the MLC storage if the actual device age is less than the wear-indicated device age by a specified margin.

10. The memory device of claim 8, wherein the memory cells allocated as the MLC storage store three or more bits of data per memory cell.

11. The memory device of claim 1, wherein the device age tracker circuit is configured to determine the device wear metric and to estimate the wear-indicated device age continuously or periodically.

12. The memory device of claim 1, wherein the GC controller is configured to initiate a GC operation in response to a trigger event including at least one of:
an actual device age exceeding an age threshold;
an actual cumulative host write count exceeding a byte count threshold; or
an actual cumulative physical write count exceeding a byte count threshold.

13. The memory device of claim 1, wherein the memory device is a solid state drive (SSD) device including NAND flash memories.

14. A method of optimizing memory utilization in a memory device via a memory controller, the method comprising:

tracking an actual device age of the memory device from an initial memory write operation;

determining a device wear metric using a physical write count and total writes over an expected lifetime of the memory device, the physical write count, representing an amount of data physically written to memory cells of the memory device accumulated over the tracked actual device age;

estimating a wear-indicated device age of the memory device in accordance with the determined device wear metric;

comparing the estimated wear-indicated device age to the tracked actual device age; and adjusting an amount of memory space to be freed by a garbage collection (GC) operation on a portion of the memory cells based on the comparison between the estimated wear-indicated device age and the tracked actual device age.

15. The method of claim 14, wherein adjusting the memory space to be freed by a GC operation includes:

increasing the amount of memory space to be freed by a GC operation if the actual device age exceeds the wear-indicated device age by a specified margin; and withholding the GC operation or decreasing the amount of memory space to be freed by a GC operation if the actual device age is less than the wear-indicated device age by a specified margin.

16. The method of claim 14, further comprising, based at least on the estimated wear-indicated device age, adjusting a size of a single-level cell (SLC) cache by reallocating a portion of the memory cells from the SLC cache to a multi-level cell (MLC) storage.

17. The method of claim 16, wherein adjusting the SlX cache size includes:

reducing the amount of memory cells reallocated from the SLC cache to the MLC storage if the actual device age exceeds the wear-indicated device age by a specified margin; or increasing the amount of memory cells reallocated from the SLC cache to the MLC storage if the actual device age is less than the wear-indicated device age by a specified margin.

18. The method of claim 14, further comprising determining the physical write count using a host write count and a write amplification, and wherein determining the device wear metric further includes using an endurance metric of the memory device.

19. The method of claim 14, wherein estimating the wear-indicated device age includes using the expected lifetime of the memory device and the determined device wear metric.

20. The method of claim 14, comprising detecting a trigger event, and initiating a GC operation in response to the detection of the trigger event, wherein the trigger event includes at least one of:

the actual device age exceeding an age threshold;

an actual cumulative host write count exceeding a byte count threshold; or an actual cumulative physical write count exceeding a byte count threshold.

\* \* \* \* \*